US008739099B1

(12) United States Patent
Maruri et al.

(10) Patent No.: US 8,739,099 B1
(45) Date of Patent: May 27, 2014

(54) METHOD AND APPARATUS FOR DETERMINING CLOCK UNCERTAINTIES

(75) Inventors: Victor R. Maruri, Mountain View, CA (US); Boon Jin Ang, Penang (MY); Henry Y. Lui, San Jose, CA (US); Surinder Singh, San Jose, CA (US); Thow Pang Chong, Penang (MY); Tony K. Ngai, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 1312 days.

(21) Appl. No.: 12/176,379

(22) Filed: Jul. 20, 2008

Related U.S. Application Data

(60) Provisional application No. 60/951,183, filed on Jul. 20, 2007.

(51) Int. Cl.
*G06F 17/50* (2006.01)
*G06F 9/455* (2006.01)

(52) U.S. Cl.
USPC .......................................... 716/113; 716/136

(58) Field of Classification Search
USPC .................................................. 716/113, 136
See application file for complete search history.

(56) References Cited

U.S. PATENT DOCUMENTS

| | | | | |
|---|---|---|---|---|
| 5,381,524 | A | * | 1/1995 | Lewis et al. ..................... 715/804 |
| 5,576,979 | A | * | 11/1996 | Lewis et al. ..................... 716/102 |
| 5,790,435 | A | * | 8/1998 | Lewis et al. ..................... 716/102 |
| 6,288,589 | B1 | * | 9/2001 | Potter et al. ..................... 327/295 |
| 6,910,194 | B2 | * | 6/2005 | Mielke et al. ................... 716/113 |
| 7,039,891 | B2 | * | 5/2006 | Tetelbaum ....................... 716/113 |
| 7,203,229 | B1 | * | 4/2007 | Ishida et al. ..................... 375/226 |
| 7,222,036 | B1 | * | 5/2007 | Thorne ............................ 702/79 |
| 7,295,938 | B2 | * | 11/2007 | Nakashiba et al. .............. 702/69 |
| 7,339,364 | B2 | * | 3/2008 | Kam et al. ................... 324/76.54 |
| 7,454,301 | B1 | * | 11/2008 | Daud et al. ....................... 702/69 |
| 7,523,426 | B2 | * | 4/2009 | Dirks et al. ..................... 716/113 |
| 7,644,385 | B1 | * | 1/2010 | Boyle et al. .................... 716/138 |
| 7,702,009 | B2 | * | 4/2010 | Akimoto ......................... 375/226 |
| 7,890,904 | B2 | * | 2/2011 | Murgai et al. .................. 716/113 |
| 8,001,508 | B1 | * | 8/2011 | Daud et al. ..................... 716/115 |
| 2007/0150218 | A1 | * | 6/2007 | Akimoto ......................... 702/69 |
| 2008/0012549 | A1 | * | 1/2008 | Kam et al. ................... 324/76.54 |
| 2008/0265957 | A1 | * | 10/2008 | Luong et al. ................... 327/156 |
| 2009/0102452 | A1 | * | 4/2009 | Kam et al. ................... 324/76.53 |
| 2009/0150846 | A1 | * | 6/2009 | Dirks et al. ........................ 716/6 |
| 2009/0217231 | A1 | * | 8/2009 | Ban ................................. 716/18 |

OTHER PUBLICATIONS

R. Franch et al., On-chip Timing Uncertainty Measurements on IBM Microprocessors, 2008 IEEE International Test Conference, pp. 1-7, Oct. 2008.*
V. Reinhardt, A Review of Time Jitter and Digital Systems, Proceedings of the 2005 IEEE International Frequency Control Symposium and Exposition, pp. 38-45, Aug. 2005.*
P. Restle et al., Timing Uncertainty Measurements on the Power5 Microprocessor, 2004 IEEE International Solid-State Circuits Conference, 8 pages, Jun. 2004.*
M. Shinagawa et al., Jitter Analysis of High-Speed Sampling Systems, IEEE Journal of Solid-State Circuits, pp. 220-224, Feb. 1990.*

* cited by examiner

*Primary Examiner* — A. M. Thompson
(74) *Attorney, Agent, or Firm* — Womble Carlyle Sandridge & Rice LLP

(57) ABSTRACT

A method for determining clock uncertainties is provided. The method includes identifying clock transfer types between registers from an integrated circuit design and identifying contributors to the clock uncertainties for each of the clock transfers. The jitter associated with each identified contributor is calculated for both set-up time and hold time. This calculated jitter is incorporated into a slack calculation to determine whether timing constraints are met for a circuit design.

18 Claims, 28 Drawing Sheets

| Transfer Type | Description |
|---|---|
| Intra-Clock | Source and destination clocks come from the same PLL/IO Clock Pin |
| Intra-Clock | Source and destination clocks come from different PLLs/IO Clock Pins |
| I/O | Transfer from off-chip to destination clock (input) or Transfer from source clock to off-chip (Output) |

| Contributor | Description |
|---|---|
| PLLJ | Jitter from PLL |
| PLLSPE | Static phase error from PLL |
| CLK | Jitter from clock networks |
| INBUF | Jitter from input buffer |
| OUTBUF | Jitter from output buffer |
| PIN | CU at the ref. clock pin specified by user |

FIG. 7A

| CU Source | Description | Hi/Lo Freq? | Random/ Deterministic |
|---|---|---|---|
| PIN | Reference Clock Pin Jitter | Hi & Lo | Deterministic |
| INBUF | Input Buffer Jitter | Hi | Deterministic |
| PLLJ | PLL Jitter | Hi | Random |
| PLLSPE | PLL Static Phase Offset | Lo | Deterministic |
| CLK | Clock Network Jitter | Hi | Deterministic |

FIG. 20A

| Rule | Analysis | Setup Uncertainty | Hold Uncertainty |
|---|---|---|---|
| I | CLKs: PINhi, PIN1o, INBUF, PLLJ11 PLLSPE11, CLK5<br>CLKd: PINhi, PIN1o, INBUF, PLLJ11 PPLSPE11, CLK6 | | |
| II, III | CLKs: PIN1o, PLLJ11, PLLSPE11, CLK5<br>CLKd: PIN1o, PLLJ11, PLLSPE11, CLK6 | | |
| IV | CLKs: CLK5<br>CLKd: CLK6 | CLK5 + CLK6 | CLK5 + CLK6 |
| VI | CLKs: PLLJ11<br>CLKd: PLLJ11 (Count only once) | PLLJ11 | |
| VII | CLKs:<br>CLKd: | | |
| VIII | Determine maximum or minimum values to be used | CLK5max<br>CLK6min<br>PPLJ11max | CLK5min<br>CLK6max |
| V | Sum up all clock uncertainty values independently for setup and hold. This is the final result. | CLK5max - CLK6max + PPLJ11max | -CLK5min + CLK6max |

FIG. 20B

METHOD AND APPARATUS FOR DETERMINING CLOCK UNCERTAINTIES

CROSS REFERENCE TO RELATED APPLICATIONS

This application claims priority from U.S. Provisional Patent Application No. 60/951,183, filed Jul. 20, 2007, and entitled "Method and Apparatus for Determining Clock Uncertainty." This provisional application is herein incorporated by reference.

BACKGROUND

Accurate timing closure is an essential part of any programmable logic device, or any other integrated circuit design flow. As designs are reaching device maximum frequencies, the margin left for correct timing closure is shrinking with every new design. Consequently, no guard band is left for error. Thus, for any integrated circuit, especially non-reprogrammable integrated circuits, it is important to account for clock uncertainties in order to avoid redesigns and costly mask changes should a design not work out after being committed to silicon.

Clock uncertainty needs to be considered in order to guarantee timing analysis accuracy. In an ideal situation, the clock edge in a system will be repeated at a fixed interval of time. However, due to noise, coupling and other effects, the clock edge will wander from the ideal position, causing both setup and hold clock uncertainty during a register-to-register data transfer. Whenever the setup or hold time spec is violated, an error occurs in the data transfer, which causes the circuit to function incorrectly.

Traditional systems with one or no PLL could get around calculating the clock uncertainty by ignoring it or adding an extra guard band to the timing closure. As the complexity of the system increased, additional clock uncertainty was added. However, this additional clock uncertainty was estimated rather than calculated and did not realistically represent the actual number.

Accordingly, there is a need to determine an impact of clock uncertainties on an integrated circuit design during the design phase to avoid costly re-designs.

SUMMARY

Embodiments of the present invention provide a method and a framework for calculating clock uncertainty for an integrated circuit design. It should be appreciated that the present invention can be implemented in numerous ways, such as a process, an apparatus, a system, a device or a method on a computer readable medium. Several inventive embodiments of the present invention are described below.

In one aspect of the invention, a method for determining clock uncertainties is provided. The method includes identifying clock transfer types between registers from an integrated circuit design and identifying contributors to the clock uncertainties for each of the clock transfers. The jitter associated with each identified contributor is calculated for both set-up time and hold time. This calculated jitter is incorporated into a slack calculation to determine whether timing constraints are met for a circuit design. Thus, prior to committing a design to silicon, the designer is able to have more confidence that the timing constraints are met. The method operations may be embodied onto a computer readable medium and as program instructions to cause a processor to execute the functionality described herein. In another embodiment, a computing system having the program instructions in memory is provided.

BRIEF DESCRIPTION OF THE DRAWINGS

The present invention will be readily understood by the following detailed description in conjunction with the accompanying drawings, and like reference numerals designate like structural elements.

FIG. 7A is a table illustrating clock uncertainty contributors in accordance with one embodiment of the invention.

FIGS. 20A and 20B illustrate tables providing exemplary results of the application of the clock uncertainty logic to a circuit design in accordance with one embodiment of the invention.

DETAILED DESCRIPTION

Embodiments of the present invention provide a method and a framework for calculating clock uncertainty for an integrated circuit design. It will be obvious, however, to one skilled in the art, that the present invention may be practiced without some or all of these specific details. In other instances, well known process operations have not been described in detail in order not to unnecessarily obscure the present invention.

The embodiments described below provide a technique for accurately determining clock uncertainties for an integrated circuit. In order to guarantee timing analysis accuracy, clock uncertainty is considered. In an ideal situation, the clock edge in a system will be repeated at a fixed interval of time. However, due to noise, coupling and other effects, the clock edge will wander from the ideal position, causing both setup and hold clock uncertainty during the register-to-register data transfer. If the setup or hold time specification is violated, an error occurs in the data transfer, which in turn causes the circuit to function improperly. The embodiments described below characterize the clock transfers as particular types of clock transfers. The possible clock uncertainty contributors are provided or identified in a given clock transfer. Then, a specific set of rules created to address the clock uncertainty for each of the identified contributors jitter are applied to obtain final setup and hold clock uncertainty values for each clock transfer. These setup and hold clock uncertainty values can then be used to determine whether the specifications for the integrated circuit are met with regard to register-to-register data transfers. If any adjustments are necessary, these changes can be made in the design stage. Clock uncertainty contributors are those elements in the clock path that can produce any kind of jitter and therefore affect the ideal clock timing. Each contributor is classified as high or low frequency, deterministic or random jitter source. As used herein, a clock uncertainty contributor is considered high frequency jitter if the frequency is greater than the PLL bandwidth, otherwise the contributor is considered low frequency jitter. If the clock uncertainty contributor shows a jitter that is always bounded in amplitude and produced by specific causes, the jitter is considered deterministic. If the jitter is characterized by a Gaussian distribution, then the jitter is considered random.

Figure 1:
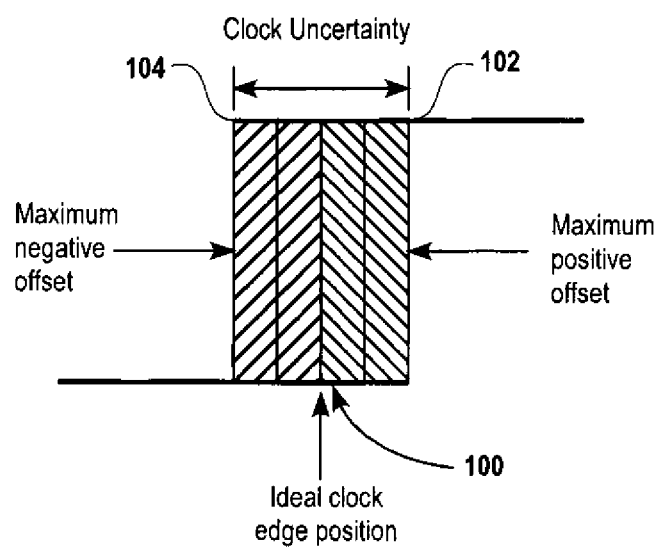
FIG. 1 is a simplified schematic diagram providing an illustration for use in explaining clock uncertainty.

FIG. 1 is a simplified schematic diagram providing an illustration for use in explaining clock uncertainty. Clock uncertainty is the difference between the clock edge maximum positive offset and the clock edge maximum negative offset. In one embodiment, the ideal clock edge position 100 will illustrate a clock edge without the impacts of noise, coupling, etc. However, due to clock uncertainty from noise, coupling, etc., the ideal clock position may move between maximum positive offset edge 102 and maximum negative offset edge 104.

Figure 2:
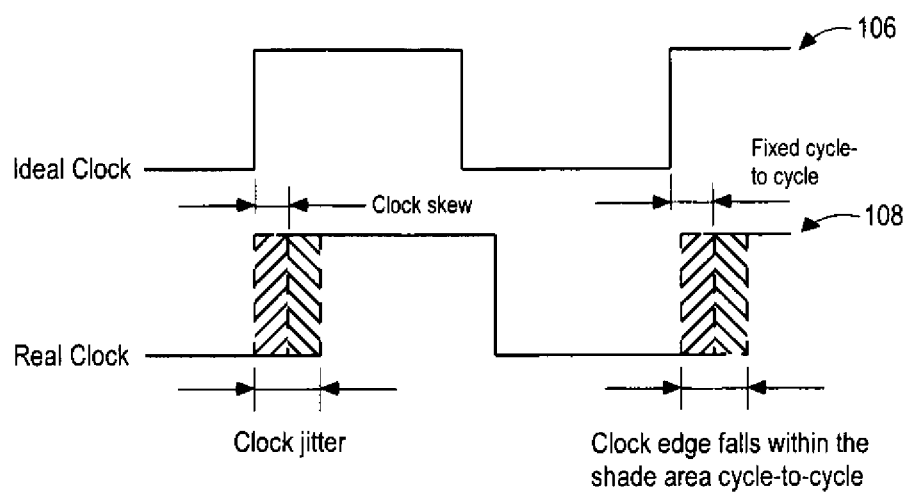
FIG. 2 is a simplified schematic diagram illustrating waveforms providing a comparison between clock skew and clock jitter.

FIG. 2 is a simplified schematic diagram illustrating waveforms providing a comparison between clock skew and clock jitter. Clock skew refers to static spatial variation between equivalent edges. As illustrated in waveform 106, the clock skew is a fixed cycle-to-cycle variation from the ideal clock waveform. Clock jitter is represented by dynamic temporal variations between adjacent edges, which may be caused by noise, coupling, etc. Thus, in waveform 108 the clock edge may fall anywhere within the shaded area from cycle-to-cycle and the clock jitter is not a fixed offset from an ideal or real clock signal.

Figures 3A, 3B:
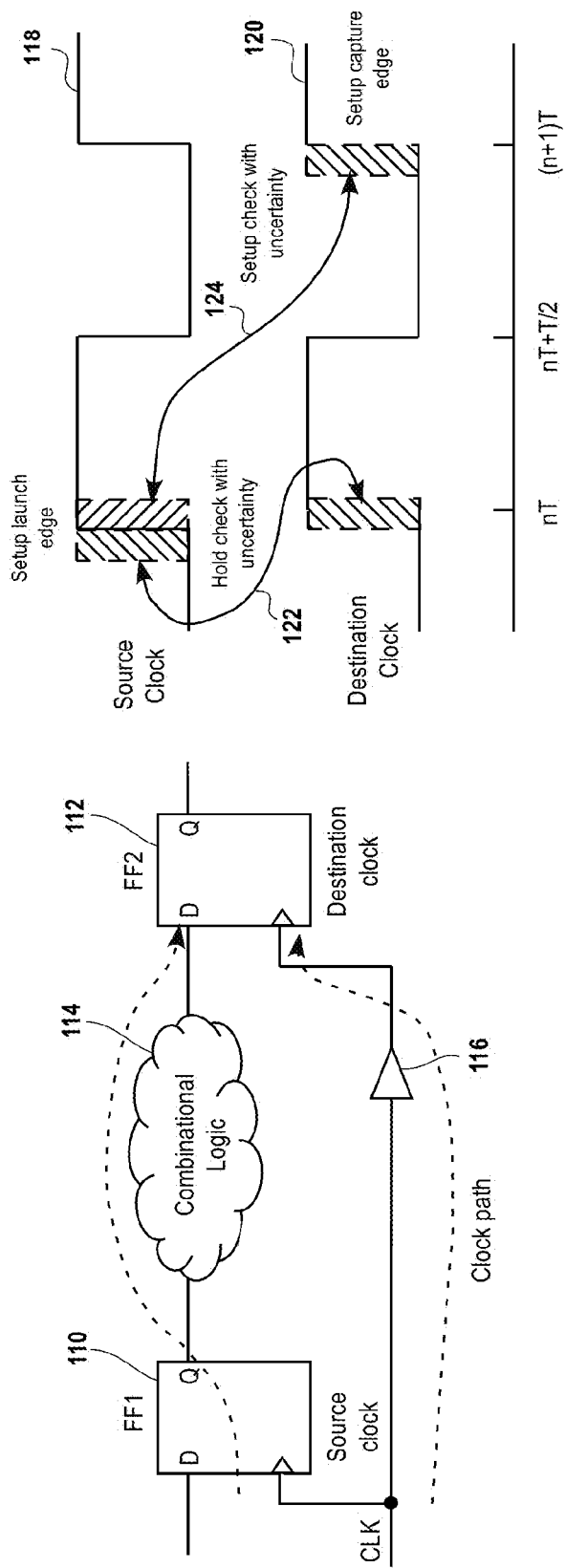
FIGS. 3A and 3B are simplified schematic diagrams illustrating the impact of the setup uncertainty and the hold uncertainty portions of the clock uncertainty associated with a register-to-register transfer.

FIGS. 3A and 3B are simplified schematic diagrams illustrating the impact of the setup uncertainty and the hold uncertainty portions of the clock uncertainty associated with a register-to-register transfer. In FIG. 3A, register 110 is configured to communicate with register 112 through combinational logic 114. A clock signal is provided to each of register 110 and 112. Register 110 may be referred to as a source register while register 112 may be referred to as a destination register in one embodiment. Similarly, source register 110 receives a source clock signal while destination register 112 receives a destination clock signal. The destination clock signal passes through buffer 116. In FIG. 3B, waveform 118 illustrates a waveform for the source clock signal in accordance with one embodiment. Waveform 120 illustrates the destination clock signal waveform. As illustrated, setup uncertainty occurs between a current period and a next period as indicated by line 124. The hold uncertainty occurs within the same period as indicated by line 122. The embodiments described herein identify these uncertainties so that a determination on the impact of data transfers can be made as described below.

Figure 4:
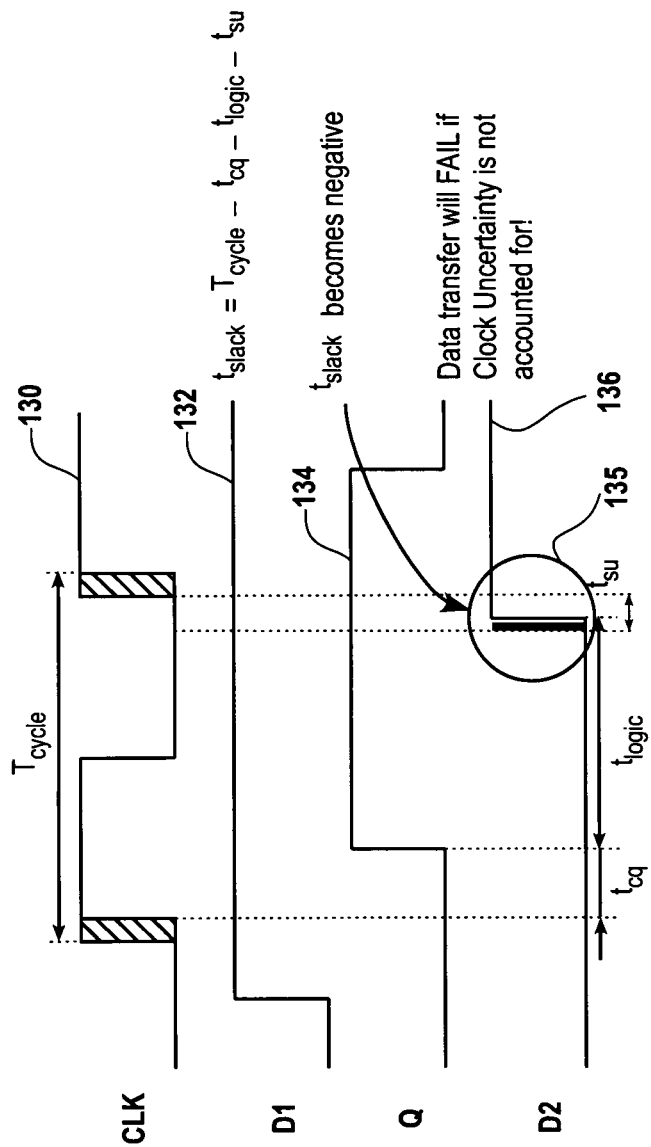
FIG. 4 illustrates a simplified schematic diagram illustrating the degradation of the timing margin in accordance with one embodiment of the invention.

FIG. 4 illustrates a simplified schematic diagram illustrating the degradation of the timing margin due to clock uncertainty. Waveforms 130, 132, 134 and 136 illustrate various waveforms that are used to determine the components that identify the slack available for the timing margin of a register-to-register data transfer. As illustrated, the slack time may become negative, as illustrated within region 135 of waveform 136, when clock uncertainty of waveform 130 is considered.

Figure 5:
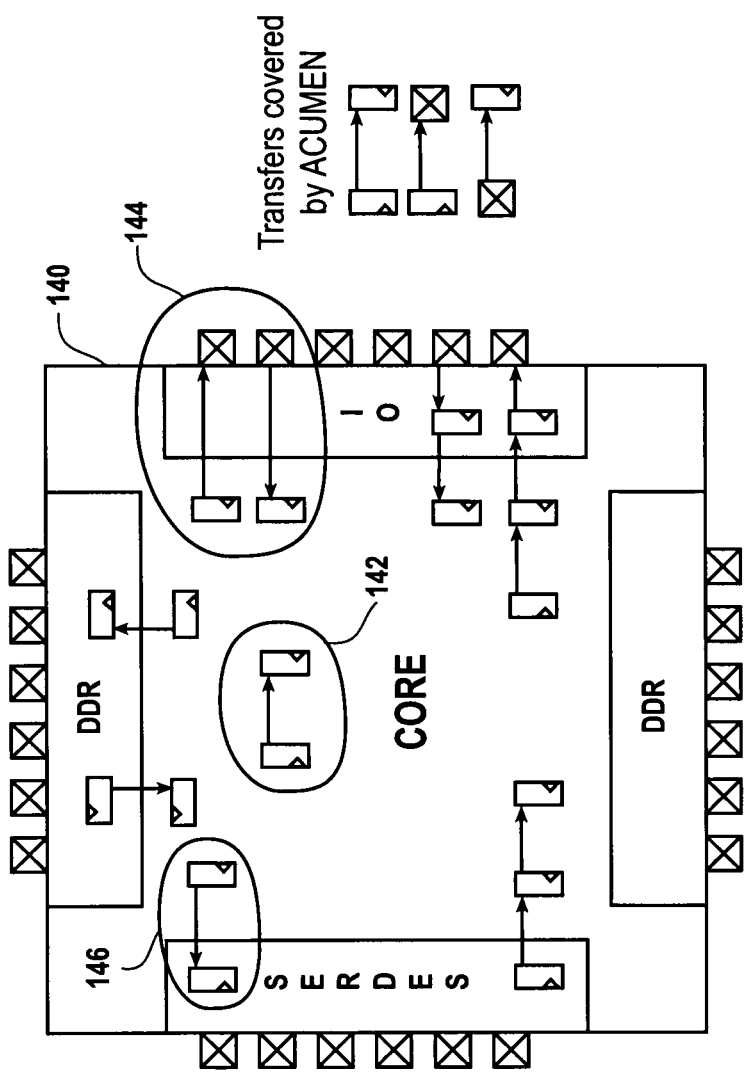
FIG. 5 is a simplified schematic diagram illustrating an integrated circuit design and the types of register-to-register transfers covered for the integrated circuit design in accordance with one embodiment of the invention.

FIG. 5 is a simplified schematic diagram illustrating an integrated circuit design and the types of register-to-register transfers covered for the integrated circuit design in accordance with one embodiment of the invention. Register-to-register transfers may occur within integrated circuit 140 between registers within the core region of the integrated circuit as illustrated in region 142. Register-to-register transfers may also occur between a register in the core region and the input/output (I/O) region as illustrated in region 144. In addition, register-to-register transfers may occur between a register in the core region and registers within specialized blocks of the integrated circuit, such as the SERDES/DDR blocks as illustrated in region 146.

Figure 6A:
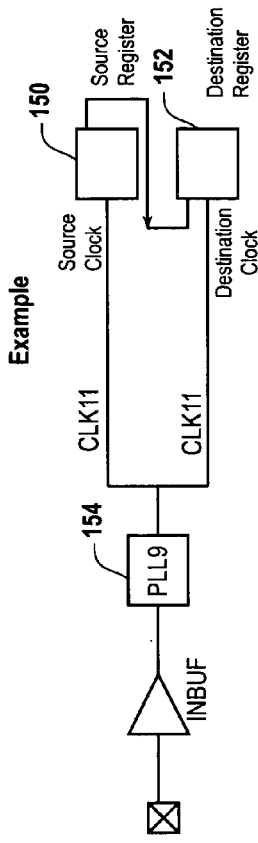
FIGS. 6A through 6C illustrate exemplary register-to-register transfer types in accordance with one embodiment of the invention.
Figure 6B:
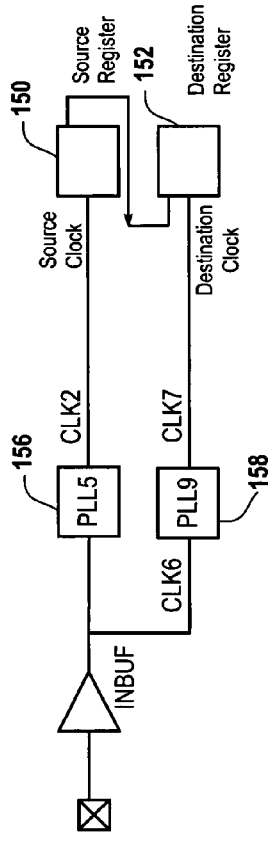
Figure 6C:
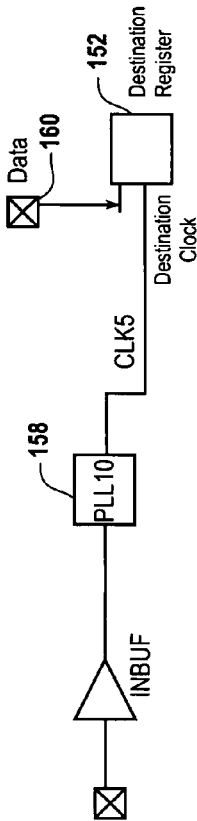

FIGS. 6A through 6C illustrate exemplary register-to-register transfer types in accordance with one embodiment of the invention. In FIG. 6A, an intra-clock transfer type is illustrated. In the intra-clock transfer type the source and destination clock signals come from the same phase lock loop (PLL) or I/O clock pin. That is, in the example of FIG. 6A, the clock signal for both source register 150 and destination register 152 comes from PLL 154. In FIG. 6B, an inter-clock transfer type is illustrated. In the inter-clock transfer type the source and destination clocks come from different PLL/IO clock pins. In FIG. 6B the source clock signal for source register 150 comes from PLL 156, while the destination clock signal for destination register 152 comes from PLL 158. FIG. 6C illustrates an I/O transfer type. In the I/O transfer type, transfers from an off-chip source to a destination register or transfers from a source register to an off-chip destination may be provided. In FIG. 6C, data 160 is being input from off-chip source into destination register 152. Destination register 152 receives the destination clock signal from PLL 158. It should be appreciated that the transfer types illustrated in FIGS. 6A-C are exemplary types and other configurations may be used, as well as combinations of the configurations in FIGS. 6A-C.

Figure 7B:
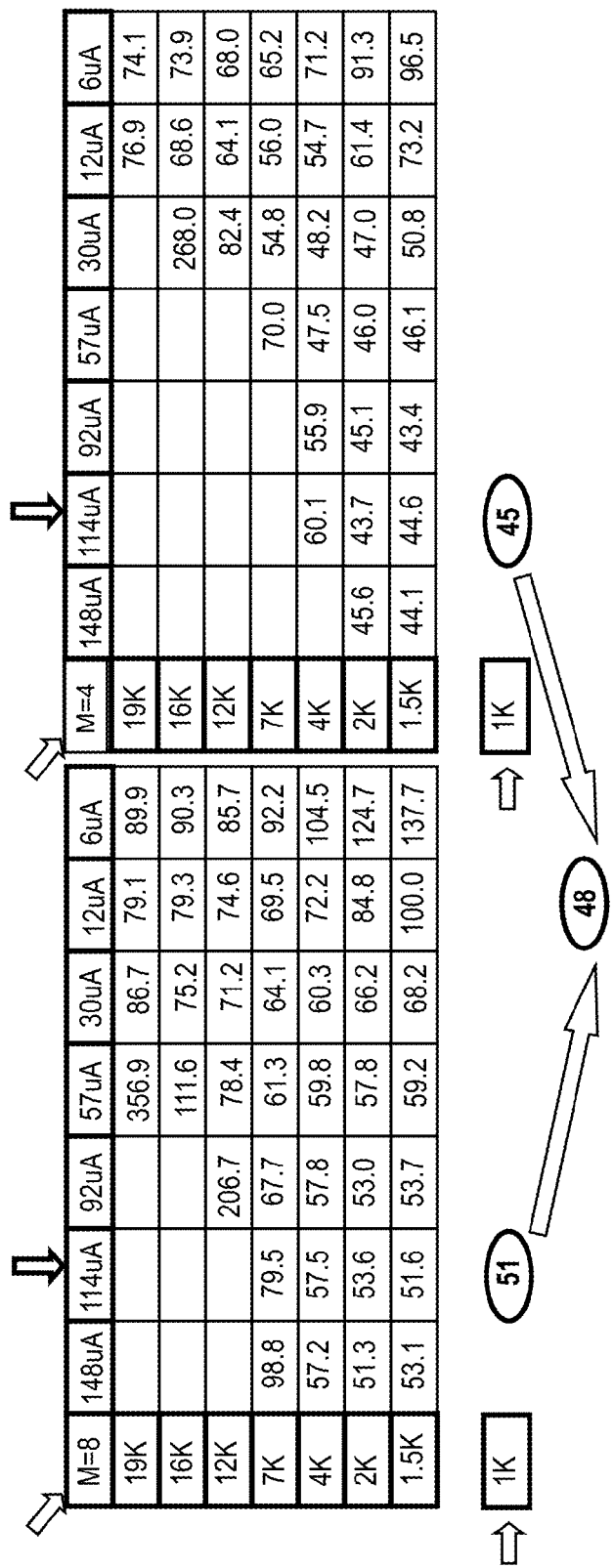
FIGS. 7B and 7C illustrate exemplary PLL look up tables in accordance with one embodiment of the invention.
Figure 7C:
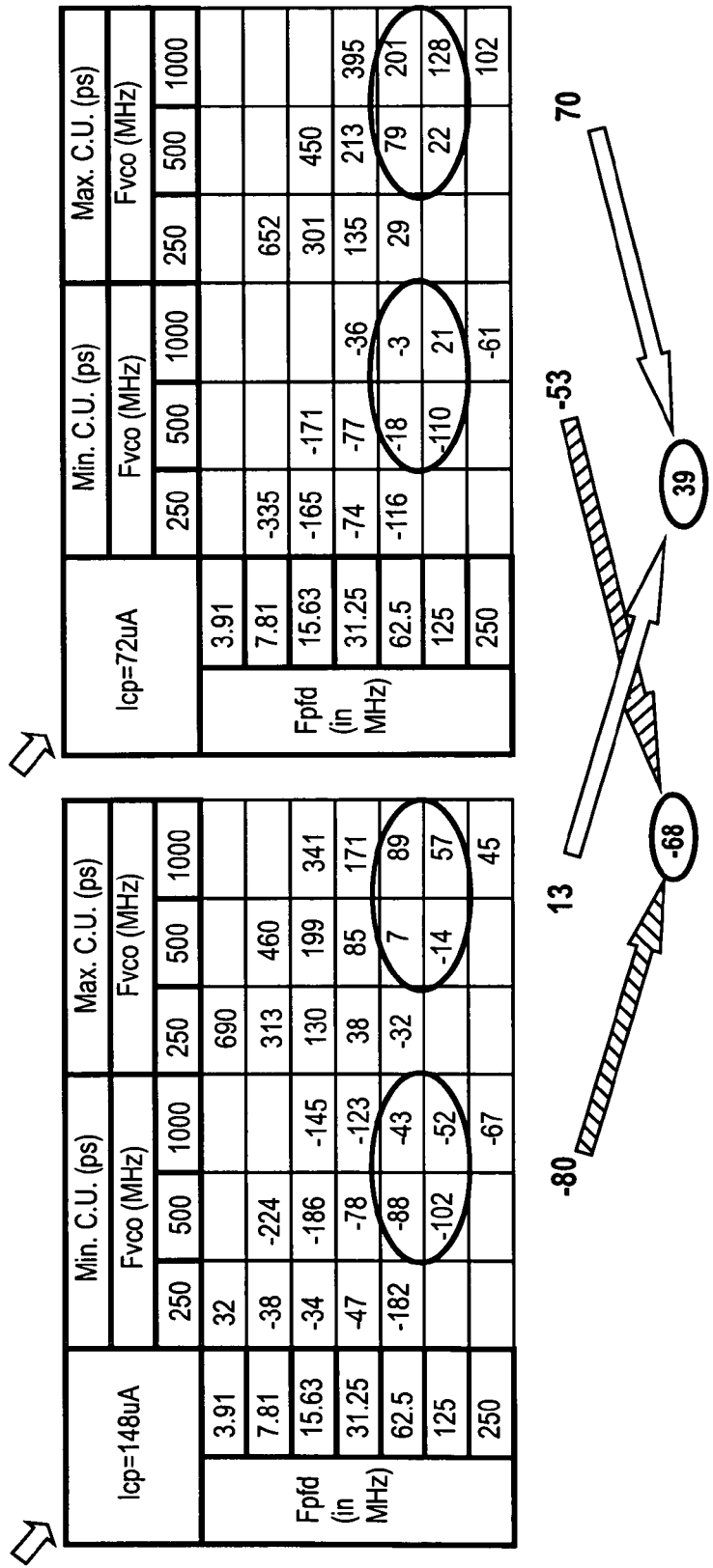

FIG. 7A is a table illustrating clock uncertainty contributors in accordance with one embodiment of the invention. In FIG. 7A, the clock uncertainty contributors of PLL J, PLL SPE, CLK, INBUF, OUTBUF, and PIN are listed. A description for each contributor is provided within the table of FIG. 7A. For example, PLLJ is jitter from the PLL, PLLSPE is static phase error from the PLL, and so on. FIGS. 7B and 7C illustrate exemplary PLL look up tables in accordance with one embodiment of the invention. FIG. 7B illustrates an exemplary PLL jitter look up table. In the example, the jitter for the parameters of M=6, $I_{cp}$=114uA and R=1 kOhm is extrapolated from the two tables as one table is for M=8 and the other is M=4. Thus, from the values of 45 and 51, a value of =/−48 picoseconds is derived for the jitter. In FIG. 7C, the static phase error, which is the difference in time between the reference and feedback clocks at the phase frequency detector when the PLL is in lock node, is derived. In these embodiments a positive static phase error indicates that the PLL output phase is delayed and vice versa. One skilled in the art will appreciate that this causes a static phase shift but the amount can vary with process voltage temperature (PVT) variation. In FIG. 7C from the look up tables, the jitter for the variable of Fvco-630 MHz, Fpfd=105 MHz, $I_{cp}$=114uA, is calculated as SPEmax=+39 ps; SPEmin=−68 ps. It should be appreciated that these settings are derived from interpolation/extrapolation from the two tables of FIG. 7C as the tables are associated with $I_{cp}$=148uA and an $I_{cp}$=72uA. It should be appreciated that the tables of FIGS. 7B and 7C are based on the jitter measurement data and SPE measurement data, respectively.

FIGS. 8-15 illustrate exemplary rules used in determining the clock uncertainty for an integrated circuit design in accordance with one embodiment of the invention. The rules may be embodied as program instructions which take a file of a design as input to determine the clock uncertainties. One skilled in the art will appreciate that numerous electronic design automation tools are available commercially, such as the QUARTUS™ tool of the assignee. These tools have files from which data may be extracted so that the rules listed herein may be applied in order to determine a value for clock uncertainties for the design.

Figure 8:
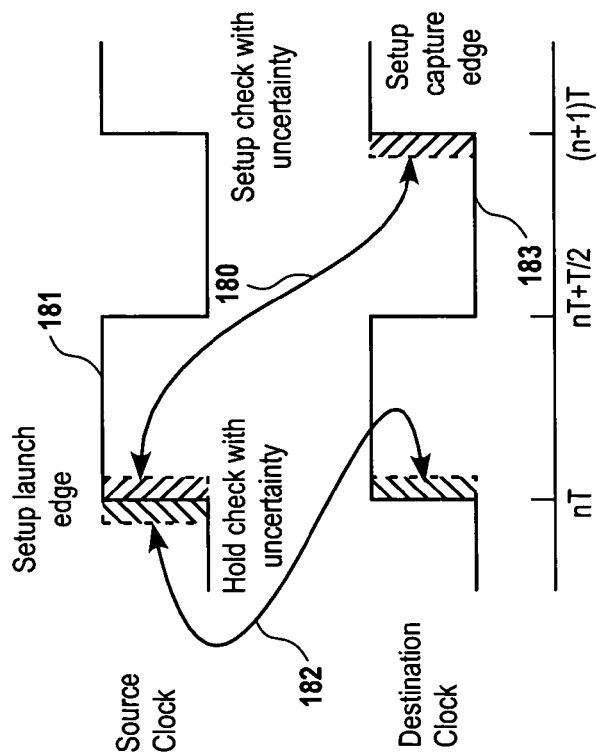
FIGS. 8-15 illustrate exemplary rules used in determining the clock uncertainty for an integrated circuit design in accordance with one embodiment of the invention.
Figure 8:
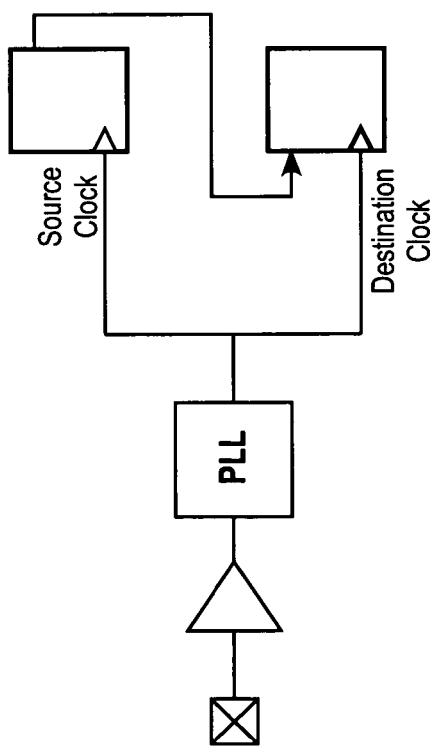

FIG. 8 is a simplified schematic diagram illustrating a rule for the setup and hold uncertainties in accordance with one embodiment of the invention. In FIG. 8, the setup uncertainty is calculated using the slowest source clock/fastest destination clock as indicated by line 180. In addition, the hold uncertainty is calculated using the fastest source clock/slowest destination clock as indicated by line 182. In essence, the setup uncertainty and hold uncertainty are calculated under the worst case conditions under the rule associated with FIG. 8. Waveform 181 represents the source clock while waveform 183 represents the destination clock.

Figure 9:
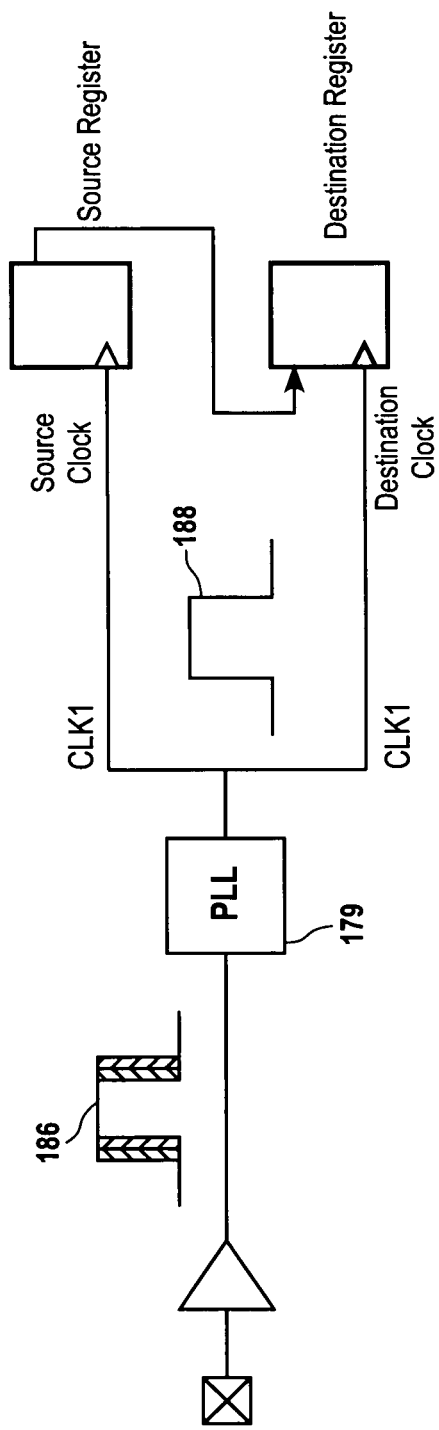

FIG. 9 is a simplified schematic diagram illustrating a rule where the PLL will filter out jitter associated with frequencies higher than the PLL bandwidth in accordance with one embodiment of the invention. As illustrated in FIG. 9, PLL 179 receives clock signal 186 which includes jitter with frequencies higher than the PLL bandwidth of PLL 179. However, PLL 180 will filter the frequencies higher than its PLL bandwidth in order to give a clean clock signal illustrated by waveform 188.

Figure 10:
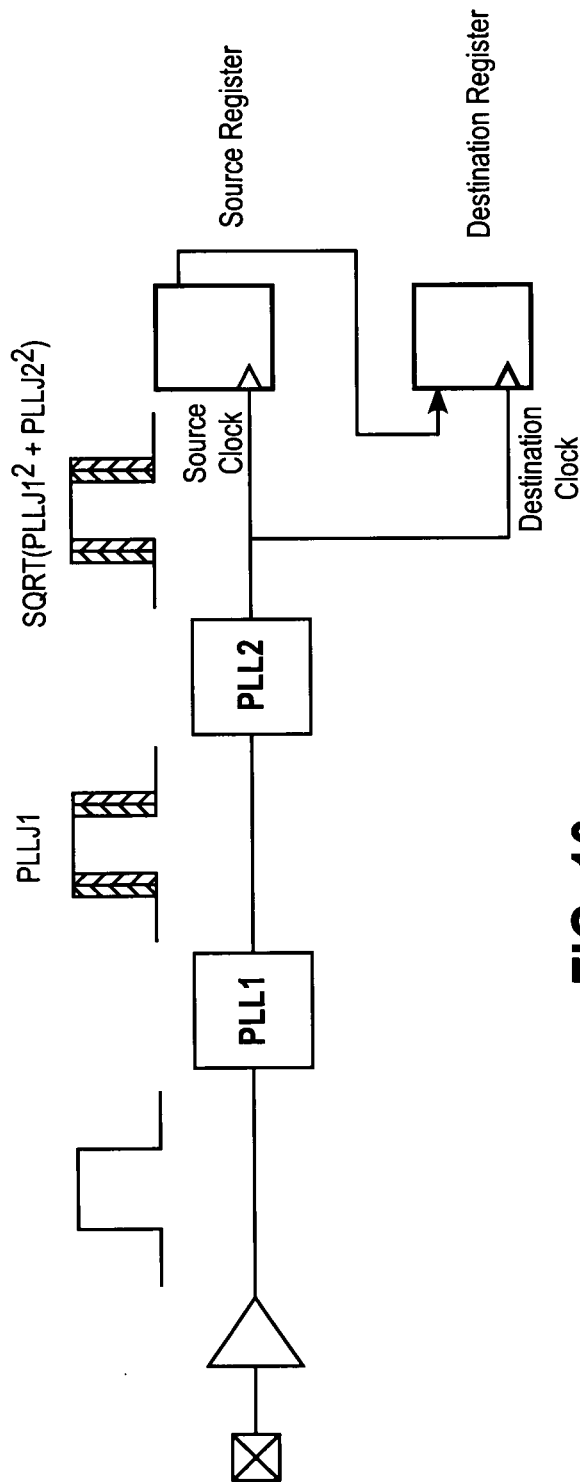

FIG. 10 illustrates a simplified schematic diagram specifying that random jitters are added using the root sum square (RSS) method while deterministic jitters are added using a linear method. In FIG. 10, the jitter associated with PLL 1 and PLL 2 is added through a RSS method. However, if the jitter is deterministic then these jitters are added using a linear method. According to one embodiment, random jitter is characterized by a Guassian distribution and is not bounded, while deterministic jitter is characterized by being bounded in amplitude and produced by specific causes.

Figure 11:
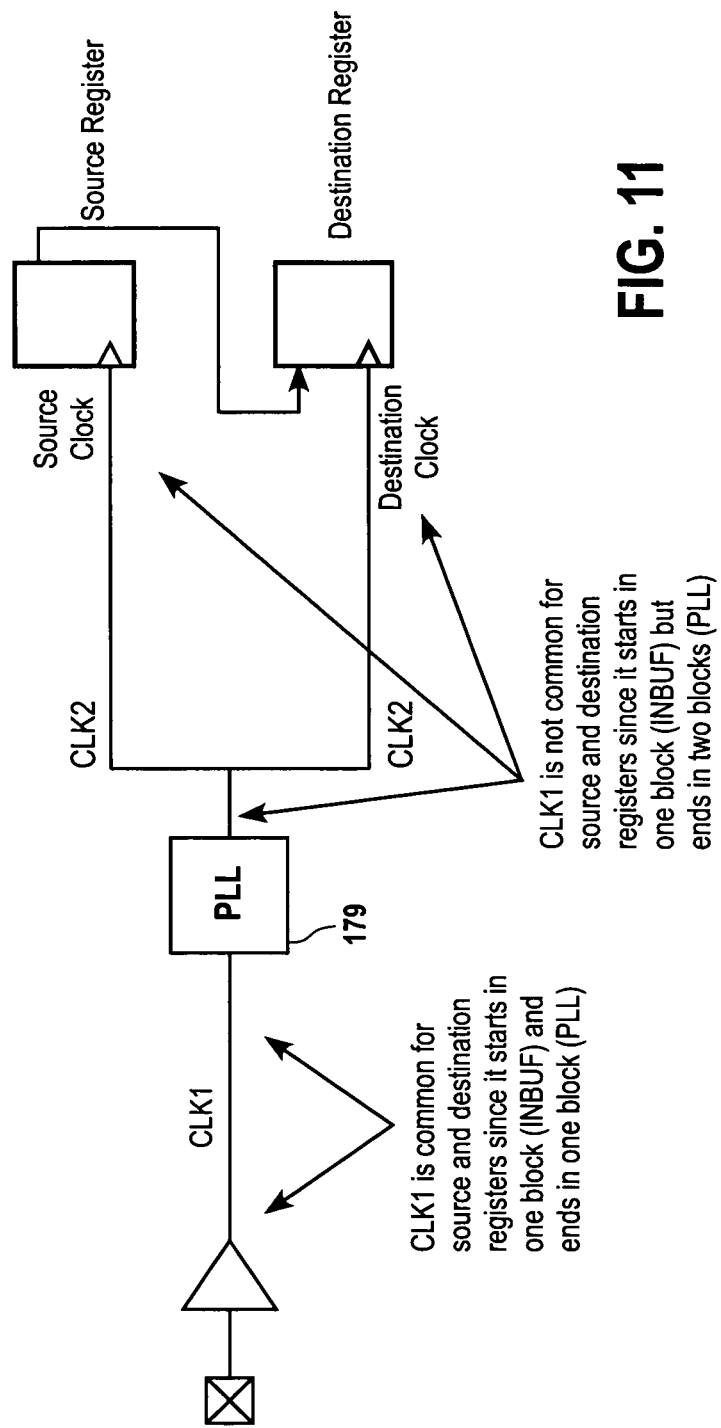

FIG. 11 is a simplified schematic diagram for illustration of a rule determining whether clock networks are common or uncommon in accordance with one embodiment of the invention. Clock networks are common when they originate and terminate in the same blocks. As illustrated in FIG. 11, clock 1 is common for the source and destination registers since clock 1 starts in one block and ends in one block. However, clock 2 is not common for the source and destination registers since clock 2 starts in one block and ends in two blocks.

Figure 12A:
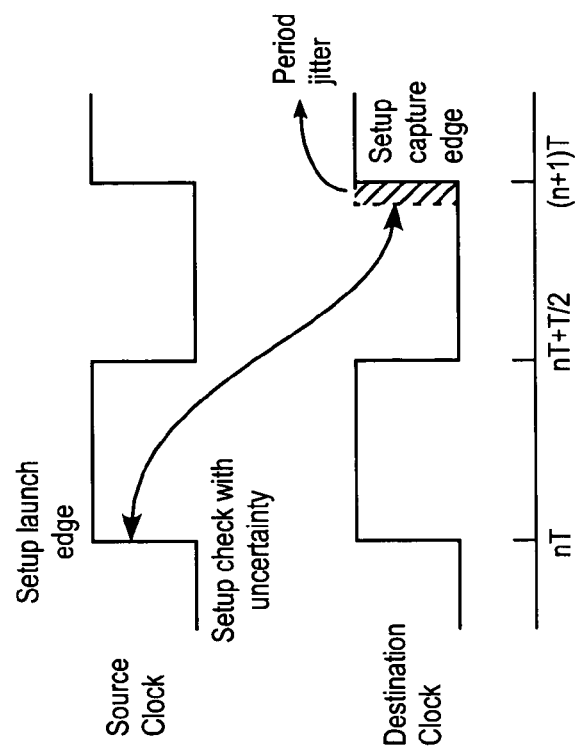
Figure 12A:
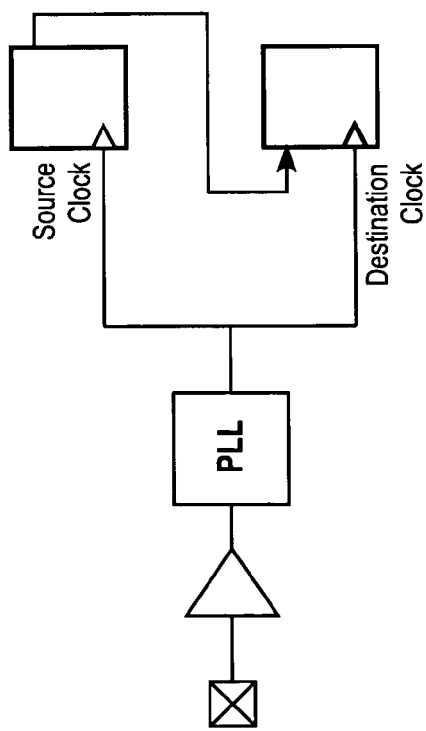
Figure 12B:
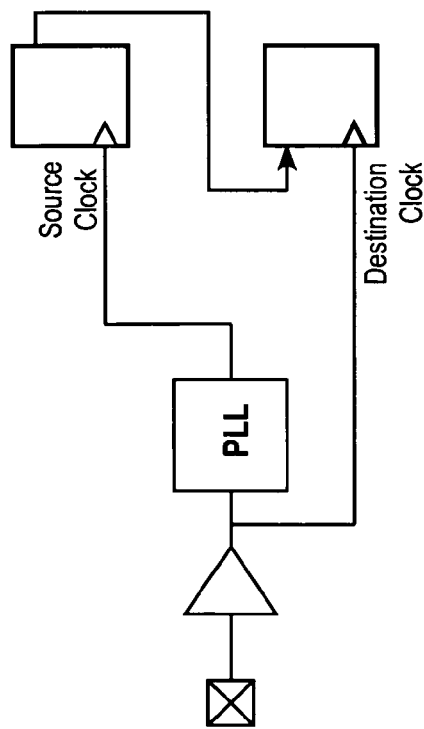
Figure 12B:
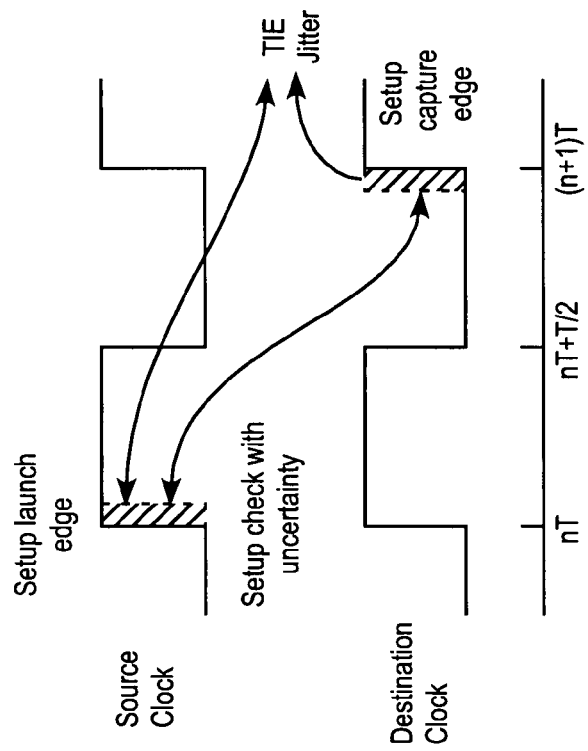

In FIGS. 12A and 12B, a rule for determining the setup uncertainty is illustrated in accordance with one embodiment of the invention. For the setup uncertainty, which is measured from a current cycle to a next cycle, the period jitter is used for common jitter contributors, while the time interval error (TIE) jitter is used for non-common jitter contributors. As illustrated in FIG. 12A the source clock and the destination clock originate from the PLL and consequently the PLL is a common jitter contributor for the source and destination clocks. In FIG. 12B the source clock receives jitter from the PLL, while the destination clock is tied to the input pin without being tied to the PLL. Thus, in this example, the PLL is a non-common jitter contributor.

Figures 13A, 13B:
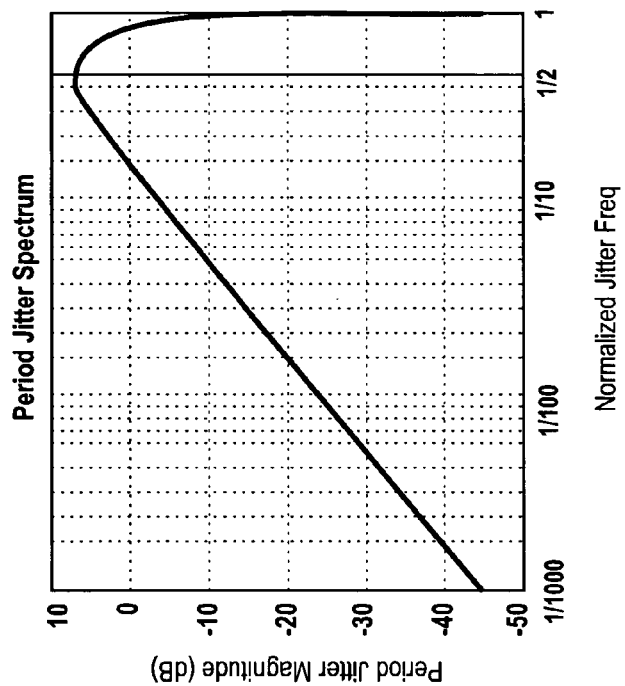

FIG. 13A is a simplified schematic diagram illustrating a rule for determining setup uncertainty where the effect of common jitter contributors is small relative to period jitter in accordance with one embodiment of the invention. Where the effect of common jitter contributors is relatively small to the period jitter, then the common jitter is ignored under this rule. As illustrated by line 189 of FIG. 13A, the effect of the common jitter is negligible from edge to edge. One skilled in the art will appreciate that the period jitter is typically −3 decibels, which will result in a normalized jitter frequency of $\frac{1}{10}^{th}$ the frequency. As illustrated in the graph of FIG. 13B, the period jitter spectrum shows that the jitter contribution from low frequencies with respect to the clock frequency is relatively small. Thus, in this embodiment the common jitter contributor is relatively small to the period jitter so the common jitter contributor is ignored.

Figure 14:
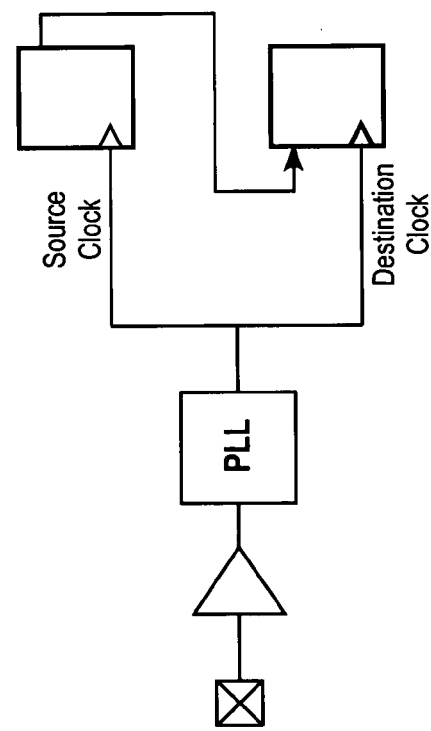
Figure 14:
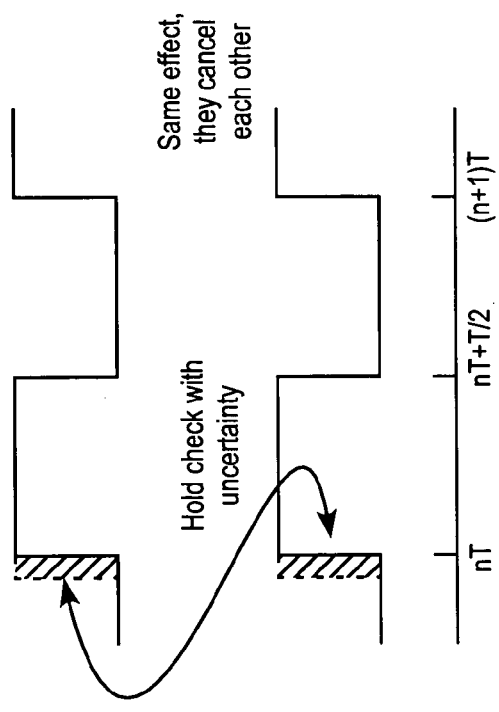
Figure 15:
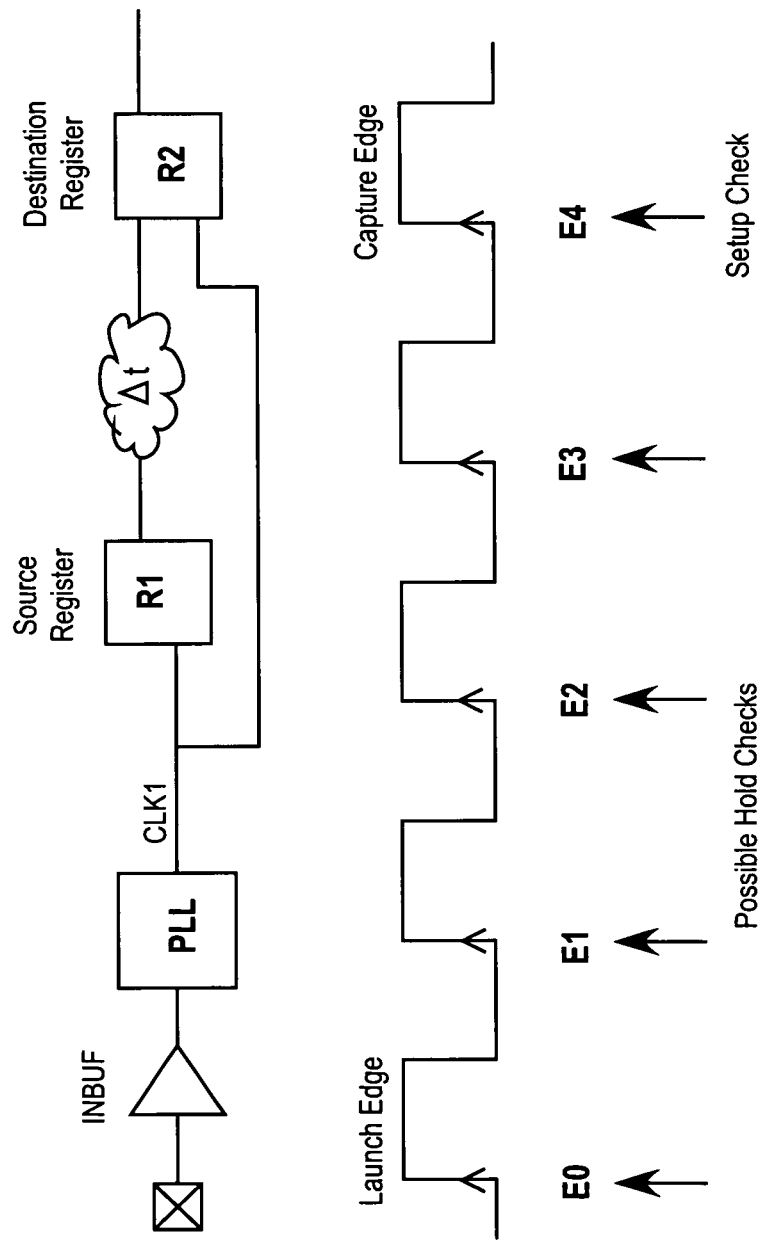

FIG. 14 illustrates a schematic diagram associated with determining hold uncertainty in accordance with one embodiment of the invention. For hold uncertainty, common jitter contributors are removed since their effect on source and destination registers are the same. That is, since the common jitter contributors would have the same effect for hold uncertainty there is no need to consider them, as the effects cancel each other out as illustrated by the source clock and destination clock waveforms of FIG. 14. Accordingly, the time interval error jitter is used for non-common contributors for the hold uncertainty. FIG. 15 is a simplified schematic diagram illustrating a rule associated with a multi-cycle clock in accordance with one embodiment of the invention. If a hold margin is checked at the launch clock edge, E0, then the reported hold uncertainty value is used for the clock uncertainty. If the hold margin is not checked at the launch clock edge, but at some other clock edge, then the setup uncertainty value is used for the hold uncertainty in this instance.

Figure 16:
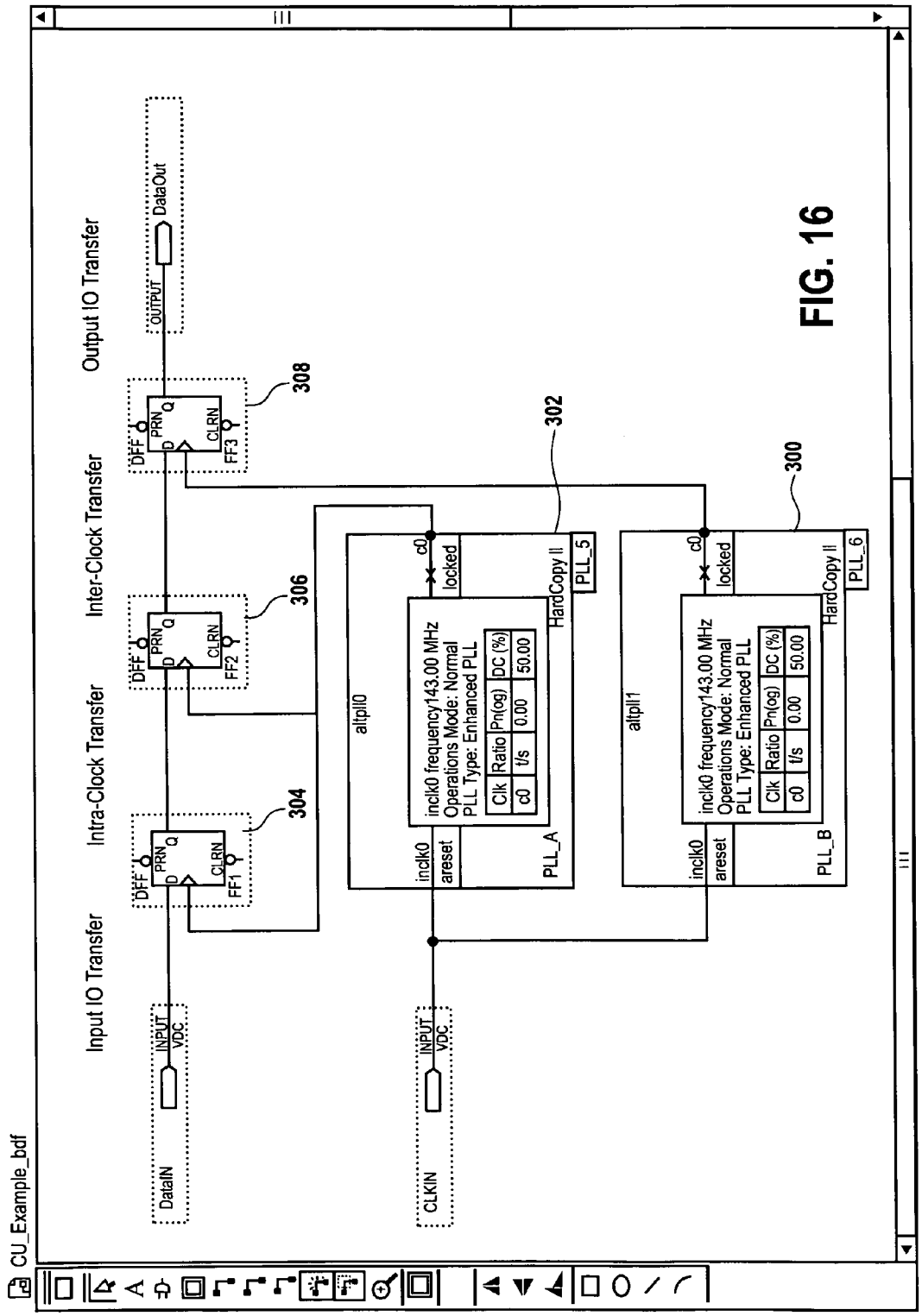
FIG. 16 is a simplified schematic diagram of a circuit design in which the embodiments described herein may be applied.

FIG. 16 is a simplified schematic diagram of a circuit design in which the embodiments described herein may be applied. The circuit diagram of FIG. 16 includes PLL 300, PLL 302, registers 304, 306 and 308. Data 2-304 illustrates an input I/O transfer, while data transfers between register 304 and 306 illustrate an intra-clock transfer as both registers 304 and 306 receive the clock signal from PLL 302. Data transfers between register 306 and 308 illustrate an inter-clock transfer as register 306 receives its clock signal from PLL 302, while register 308 receives its clock signal from PLL 300.

Figure 17A:
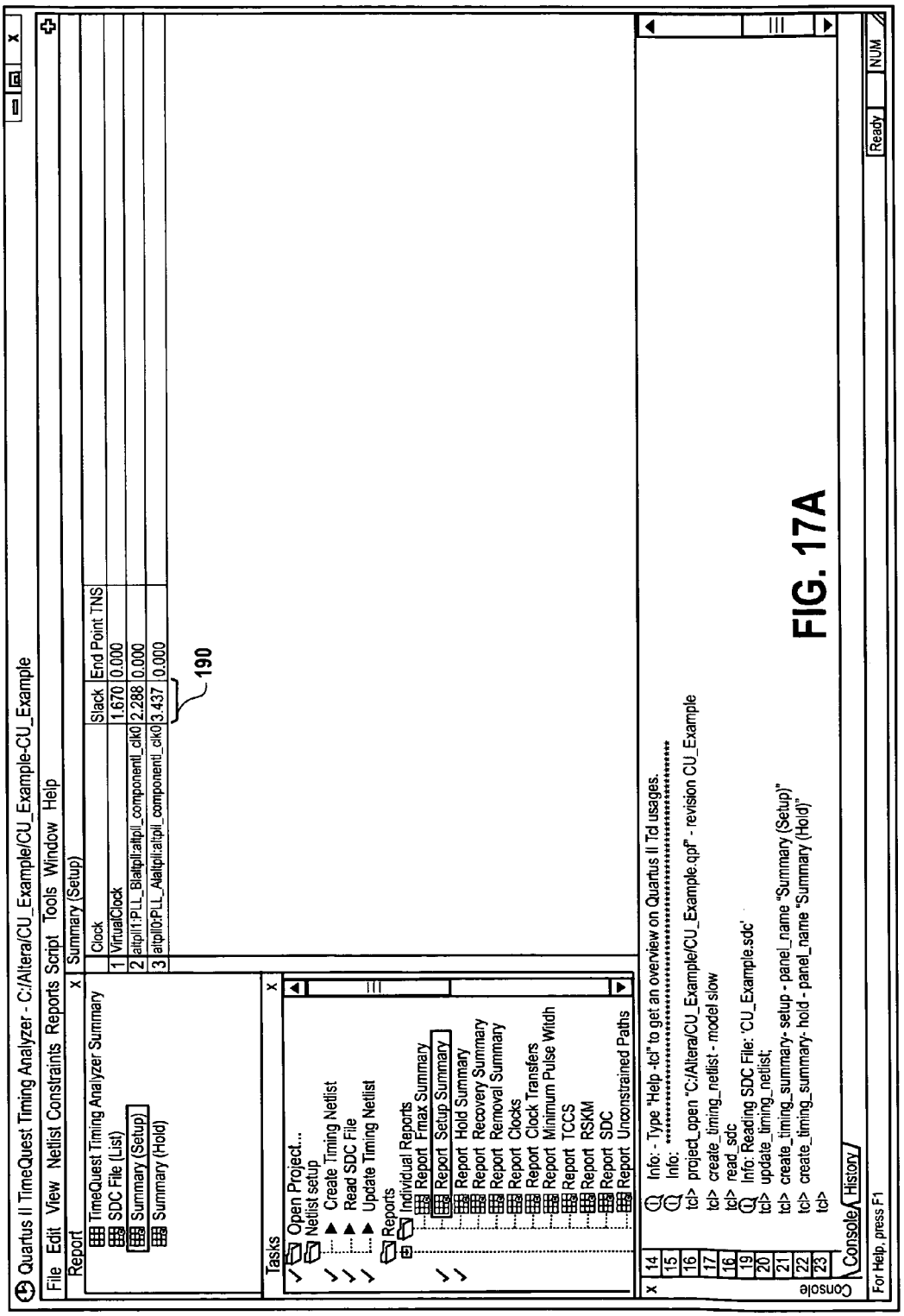
FIGS. 17A and 17B, and 18A and 18B, illustrate screen shots when the embodiments described above for the clock uncertainty technique are applied to the circuit diagram for set-up and hold times, respectively, of the design of FIG. 16 in accordance with one embodiment of the invention.
Figure 17B:
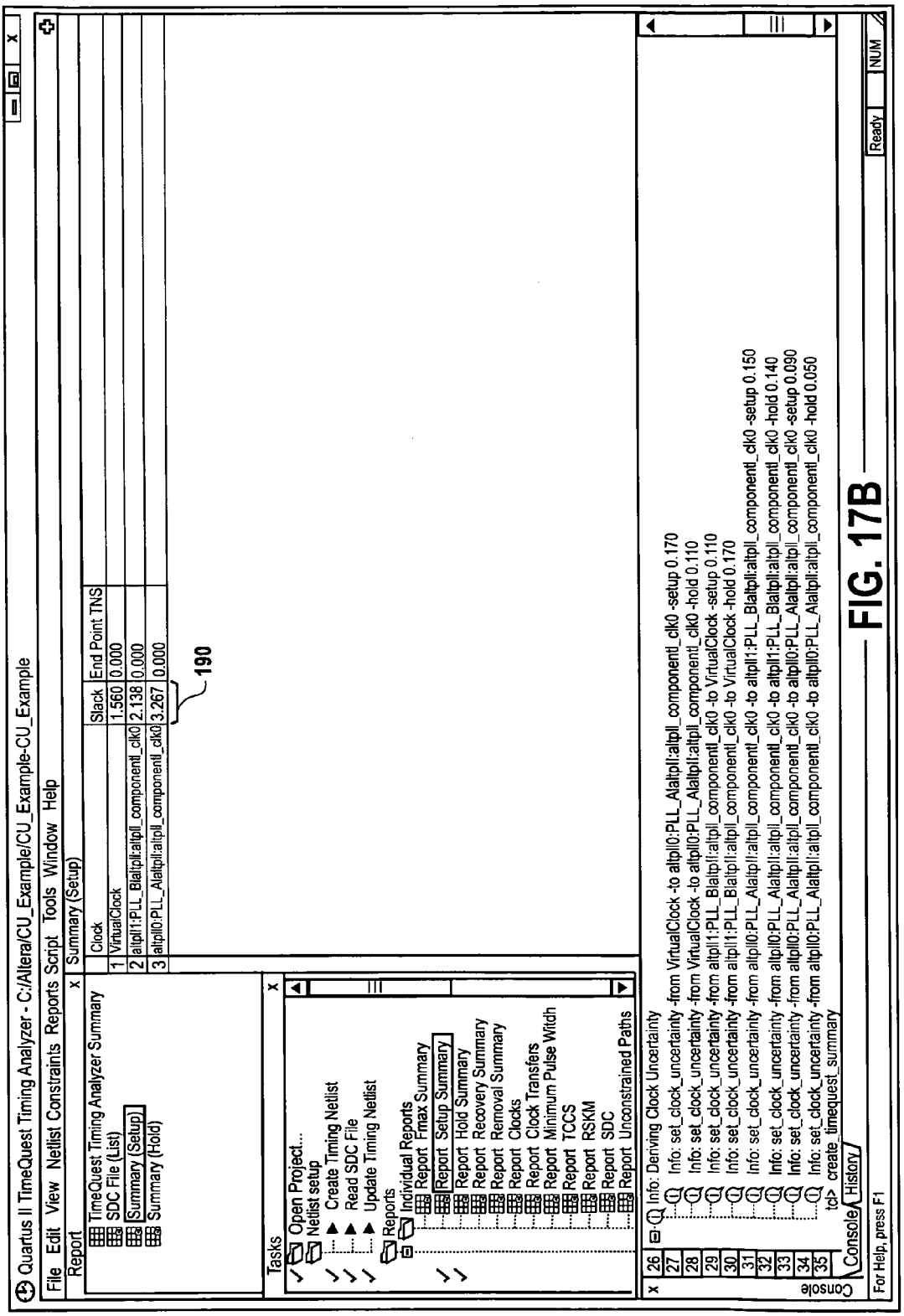
Figure 18A:
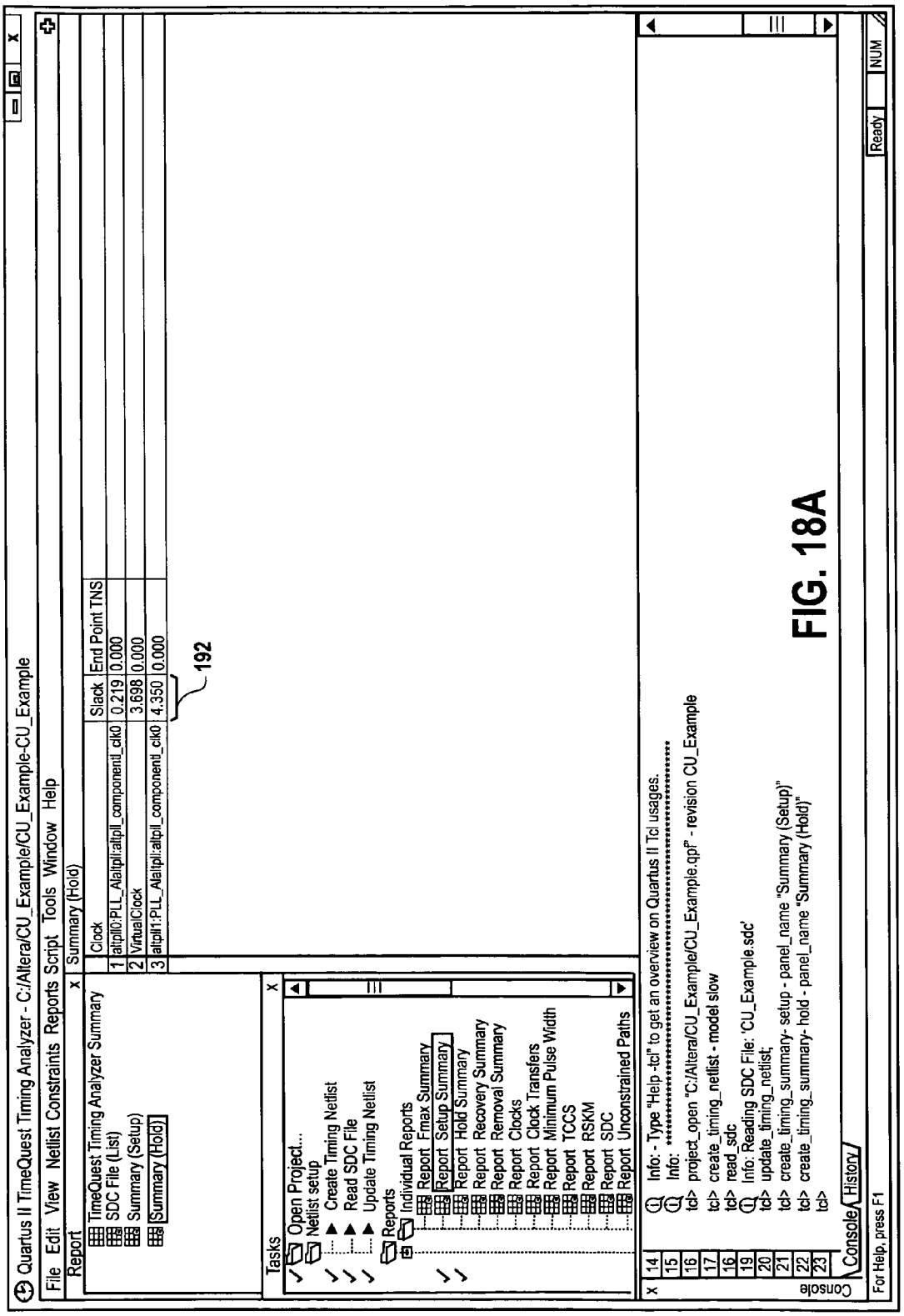
Figure 18B:
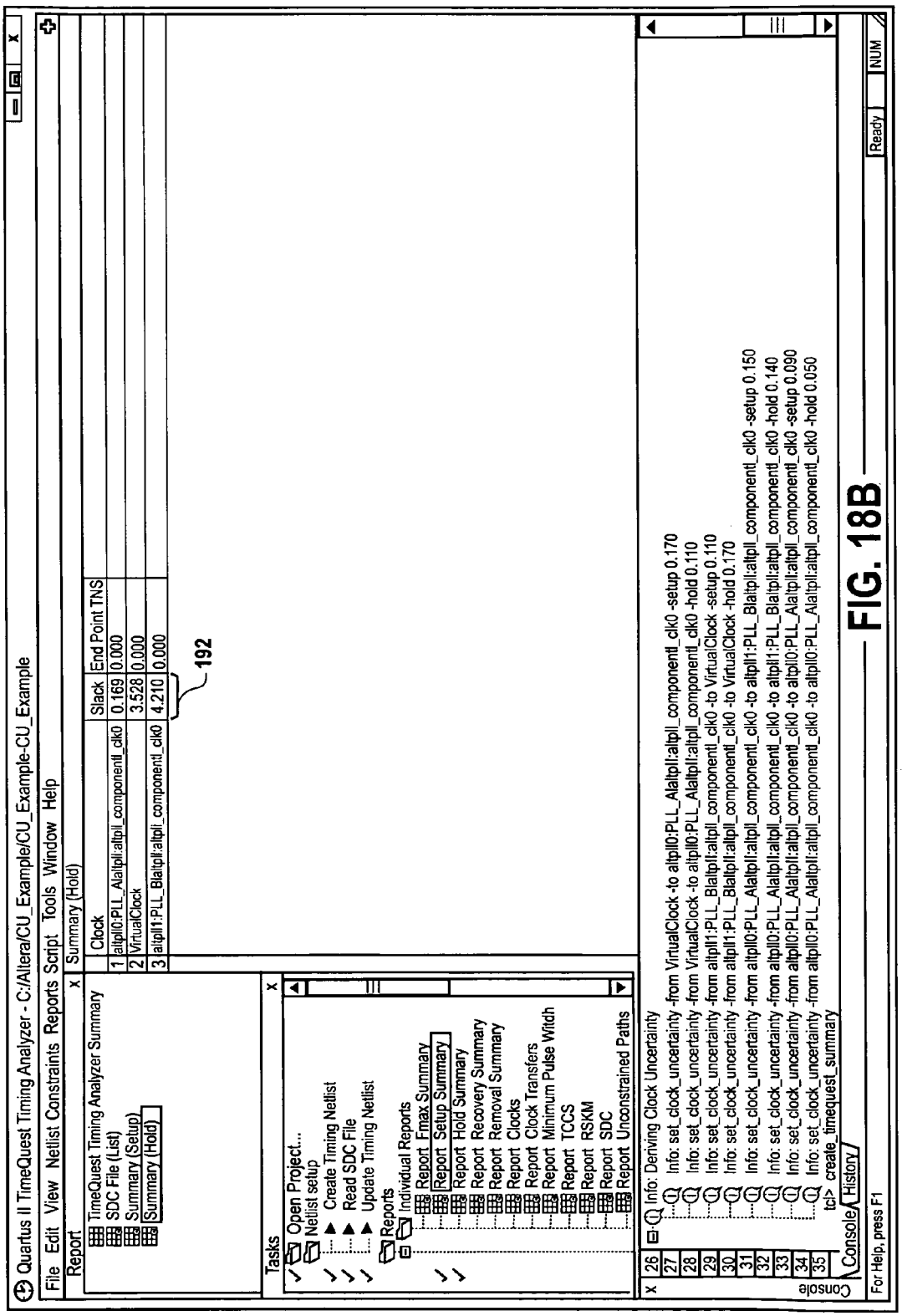

FIGS. 17A and 17B illustrate screen shots when the embodiments described above for the clock uncertainty technique is applied to the circuit diagram of FIG. 16. As illustrated in FIGS. 17A and 17B, the slack numbers of column 190 change after consideration of the clock uncertainty for the set-up times. Thus, the design can be considered with the numbers of FIG. 17B to determine if the design will meet the specifications to enable production of the chip design. In one embodiment, a negative value in column 190 will indicate a failure. Similarly, FIGS. 18A and 18B illustrate the slack prior to the clock uncertainties and after consideration of the slack uncertainties as depicted in column 192.

Figure 19:
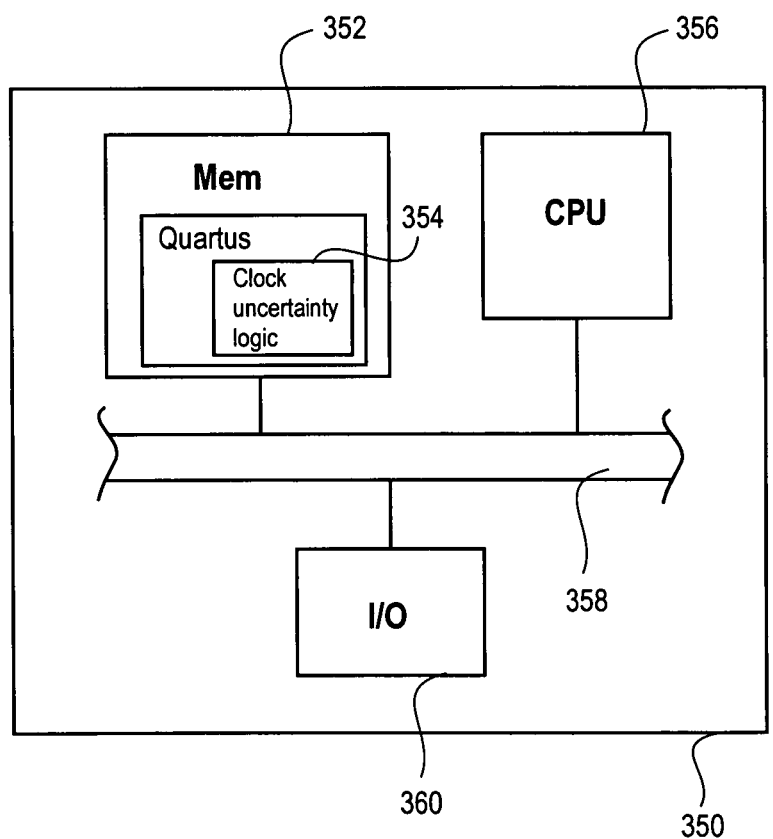
FIG. 19 is a simplified schematic diagram illustrating a system which can execute the functionality described herein to determine the clock uncertainty for a circuit design in accordance with one embodiment of the invention.

FIG. 19 is a simplified schematic diagram illustrating a system which can execute the functionality described herein to determine the clock uncertainty for a circuit design in accordance with one embodiment of the invention. System 350 includes central processing unit (CPU) 356, I/O module 360, and memory 352. CPU 356, I/O module 360, and memory 352 are in communication with each other over bus 358. Memory 352 includes clock uncertainty logic 354. Clock uncertainty logic will include instructions which when executed by CPU 356 will determine the clock uncertainty for a specific design. In one embodiment, clock uncertainty logic 354 is a module which may be included with the QUARTUS software of the assignee or any other electronic design automation software. Clock uncertainty logic 354 may be embodied as program instructions which identify clock transfers from a circuit design as well as the type of clock transfers in that circuit design. For example, clock uncertainty logic 354 may identify the register-to-register data transfers for a certain design as well as whether those transfers are inter-clock transfers, intra-clock transfers, etc. In addition, clock uncertainty logic 354 will identify all possible clock uncertainty contributors in a given clock transfer. The clock uncertainty logic 354 will also apply the rules as described above in FIGS. 8-15 to the possible clock uncertainty contributors in order to determine a clock uncertainty for each clock transfer within the circuit design. Accordingly, a designer will have some level of confidence that the clock uncertainty will not cause the design to fail so that the design can be committed to silicon. In one embodiment, the file from which the clock uncertainty logic derives information necessary to present the clock uncertainty values is a Synopsis design constraint (SDC) file, or any other suitable design constraint file or constraint file, which contains the information for the clock uncertainty logic to calculate the clock uncertainties. That is, the clock uncertainty logic may parse a Verilog or other Hardware description language file to identify the clock transfer types, characterize these paths and identify the contributors to the clock uncertainty. The rules listed above can then be applied to the clock transfer types and the corresponding contributors to provide the setup and hold time. This calculated set up and hold time can subsequently be input to a slack calculation to verify that the timing constraints of the circuit are met.

In one embodiment the clock uncertainty logic, when executed by CPU 356 causes the CPU to identify clock transfer types between registers from an integrated circuit design and identifying contributors to the clock uncertainties for each of the clock transfers. The clock transfer types may be any of the types mentioned in FIGS. 6A through 6C. The clock uncertainty contributors include any of the contributors mentioned with reference to FIG. 7A. In addition, the jitter associated with each identified contributor for both set-up time and hold time is calculated. As explained further in FIG. 20B, the setup and hold time are each calculated for each transfer type in the design. The calculated jitter is incorporated into a slack calculation to determine whether timing constraints are met for a circuit design. With reference to FIG. 4, the slack calculation may be utilized to determine if the slack becomes negative indicating a possible error in the design that could cause the circuit to malfunction.

Figure 20C:
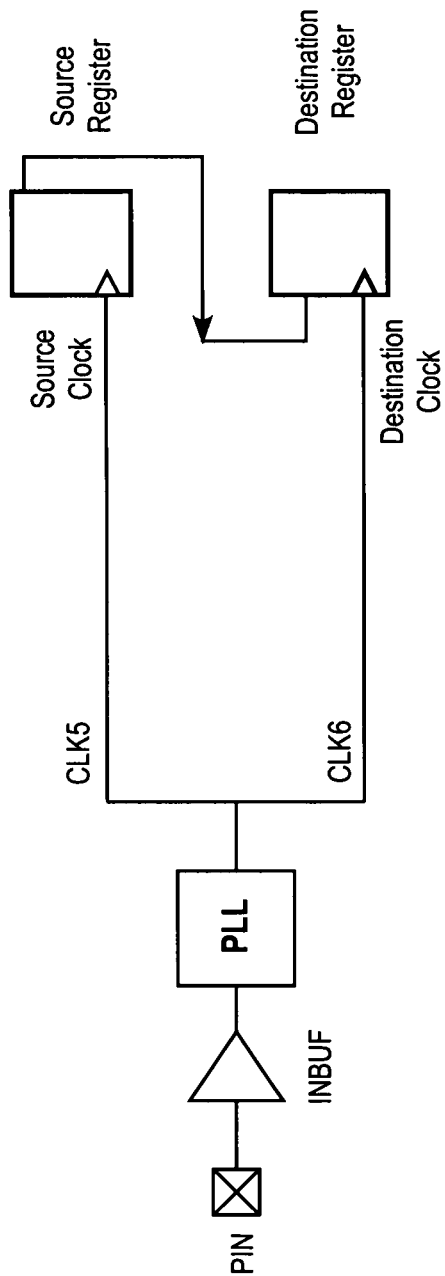
FIG. 20C illustrates an exemplary intra clock transfer used to generate the table of FIG. 20B in accordance with one embodiment of the invention.

FIGS. 20A and 20B illustrate tables providing exemplary results of the application of the clock uncertainty logic to a circuit design in accordance with one embodiment of the invention. FIG. 20A provides a table of the clock uncertainty sources identified from the intra clock transfer type illustrated in FIG. 20C. It should be appreciated that the frequency level and the characterization of jitter as random or deterministic are provided in the table of FIG. 20A. FIG. 20B provides the setup and hold uncertainty calculations for the identified transfer path of FIG. 20C according to the rules provided herein. The first row of the table of FIG. 20B traces the design of FIG. 20C from left to right to identify the contributors for each clock pathway. The contributors for the source clock (CLKs) and the destination clock (CLKd) are listed in the first row. In the second row, the PINhi and the INBUF contributors are eliminated since the PLL filters out jitters with a frequency higher than the PLL bandwidth, as mentioned with reference to FIG. 9. In the third row a determination of whether the clock networks are common as discussed with reference to FIG. 11. The clock network jitter is the addition of the correspondent source and destination clock network jitters, as the jitter from the PLL is deterministic. In the fourth row, the setup jitter is measured from the current cycle to the next cycle and the period jitter is used for common jitter contributors as illustrated with regard to FIG. 12A. In addition, any high frequency jitter is counted only once when appearing in both the source and destination clocks. In the fifth row, the hold uncertainty, which is added independently according to the embodiments described herein, common jitter contributors are removed since the effect on the source and destination registers is the same. In the sixth row, the setup uncertainty is calculated using the slowest source clock/fastest destination clock and the hold uncertainty is calculated using the fastest source clock/slowest destination clock, as discussed with reference to FIG. 8. In the seventh row, the uncertainty values are summed independently for the setup and the hold.

Figure 21:
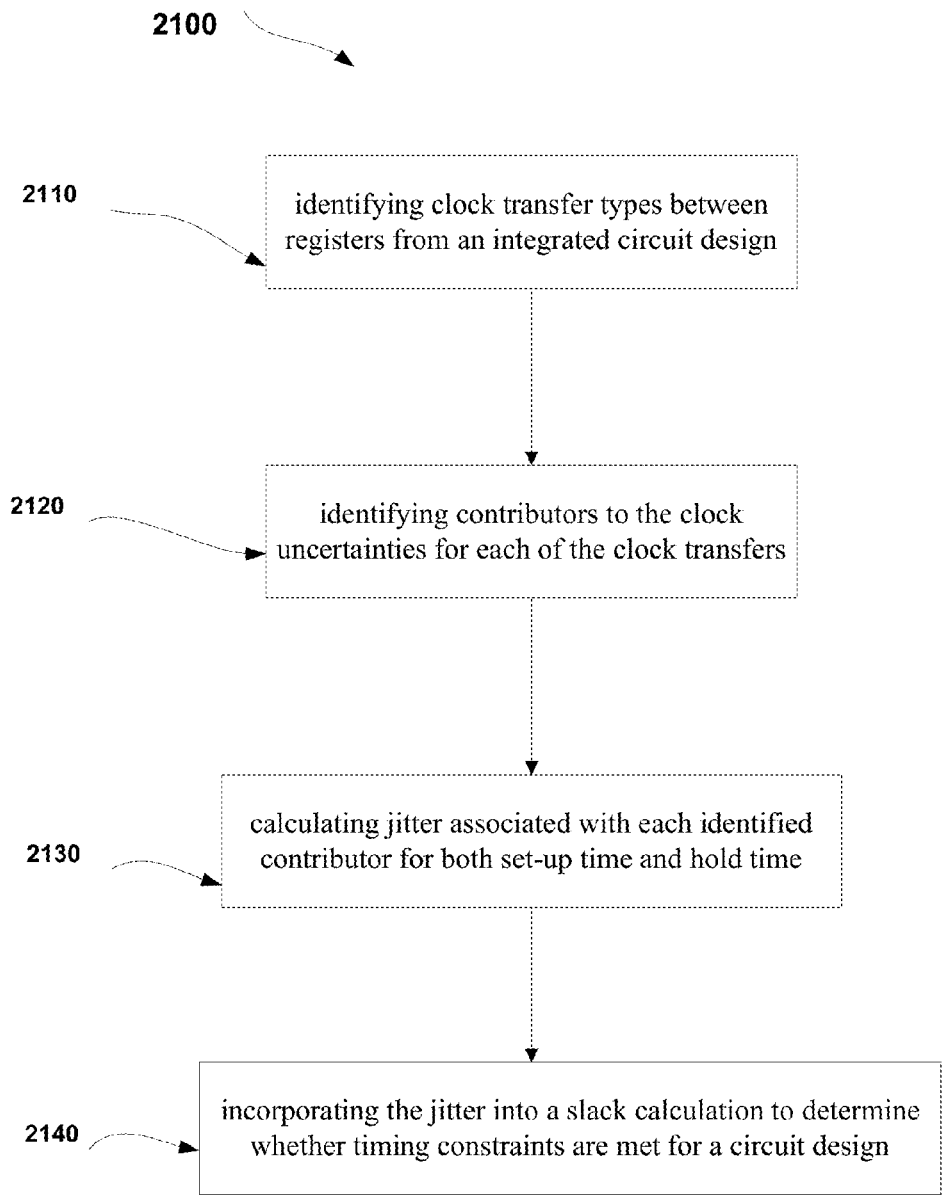
FIG. 21 is a flow diagram illustrating a method for determining clock uncertainties in accordance with one embodiment of the invention.

FIG. 21 is a flow diagram 2100 illustrating a method for determining clock uncertainties in accordance with one embodiment of the invention. Clock transfer types between registers are identified from an integrated circuit design in step 2110. Contributors to the clock uncertainties are identified for each of the clock transfers in step 2120. The jitter associated with each identified contributor is calculated for both the set-up time and the hold time in step 2130. The jitter is incorporated into a slack calculation to determine whether timing constraints are met for a circuit design in step 2140.

Figure 22:
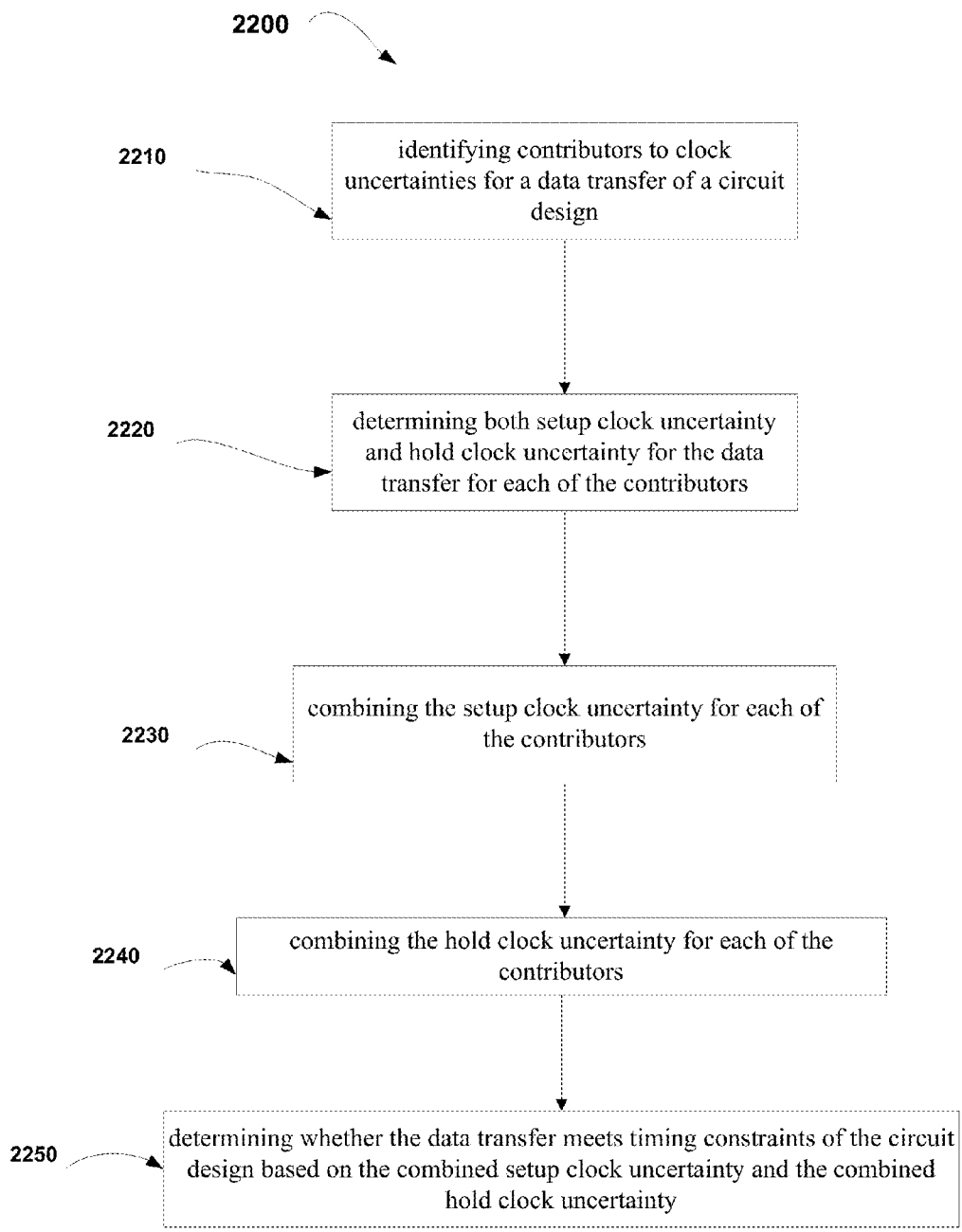
FIG. 22 is a flow diagram illustrating a method for performing timing closure analysis on a circuit design in accordance with one embodiment of the invention.

FIG. 22 is a flow diagram 2200 illustrating a method for performing timing closure analysis on a circuit design in accordance with one embodiment of the invention. The contributors to clock uncertainties are identified for a data transfer of a circuit design in step 2210. The setup clock uncertainty and hold clock uncertainty are determined for the data transfer for each of the contributors in step 2220. The setup clock uncertainty for each of the contributors is combined in step 2230. The hold clock uncertainty for each of the contributors is combined in step 2240. It is determined whether the data transfer meets timing constraints of the circuit design in step 2250. The determination is based on the combined setup clock uncertainty and the combined hold clock uncertainty.

While the embodiments, were described with respect to programmable logic devices (PLDs) and structured ASICs, the embodiments may be incorporated with any suitable integrated circuit design. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be any of the family of devices owned by the assignee or a competitor.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for determining clock uncertainties, comprising:
    identifying clock transfer types between registers from an integrated circuit design;
    identifying contributors to clock uncertainties for a source clock and a destination clock for each of the clock transfer types;
    calculating jitter associated with each identified contributor for both set-up time and hold time;
    incorporating, through a processor, the jitter into a slack calculation to determine whether timing constraints are met for the integrated circuit design; and
    determining, for each identified contributor, whether the jitter is one of a random jitter or a deterministic jitter, wherein the random jitter is incorporated into the slack calculation through a root sum square and the deterministic jitter is incorporated into the slack calculation through a linear addition.

2. The method of claim 1, wherein identifying the clock transfer types includes,
    identifying intra clock transfers wherein source clock signals and destination clock signals originate from a same source.

3. The method of claim 1, wherein identifying the clock transfer types includes,
    identifying inter clock transfers wherein source clock signals and destination clock signals originate from different sources.

4. The method of claim 1, wherein calculating jitter associated with each identified contributor for both set-up time and hold time includes,
    calculating setup time uncertainty with the source clock; and
    calculating setup time uncertainty with the destination clock.

5. The method of claim 1, wherein calculating jitter associated with each identified contributor for both set-up time and hold time includes,
    calculating hold time uncertainty with the source clock; and
    calculating hold time uncertainty with the destination clock.

6. The method of claim 1, further comprising:
    combining first subcomponents of the jitter through a root sum square technique upon determination that the first subcomponents of the jitter are random jitter; and
    combining second subcomponents of the jitter through a linear technique upon determination that the second subcomponents of the jitter are deterministic jitter.

7. A non-transitory computer readable medium having program instructions for determining clock uncertainties, comprising:
    program instructions for identifying clock transfer types between registers from an integrated circuit design;
    program instructions for identifying contributors to the clock uncertainties for each of the clock transfer types;
    program instructions for calculating jitter associated with each identified contributor for both set-up time and hold time with a source clock and a destination clock;
    program instructions for incorporating the jitter into a slack calculation to determine whether timing constraints are met; and
    program instructions for determining whether the jitter is one of a random jitter or a deterministic jitter, wherein, for each identified contributor, the jitter is incorporated into the slack calculation through a root sum square in response to a determination the jitter is random, and the jitter is incorporated into the slack calculation through a linear addition in response to a determination the jitter is deterministic.

8. The non-transitory computer readable medium of claim 7, wherein the program instructions for identifying the clock transfer types includes,
    program instructions for identifying intra clock transfers wherein source clock signals and destination clock signals originate from a same source.

9. The non-transitory computer readable medium of claim 7, wherein the program instructions for identifying the clock transfer types includes,
    program instructions for identifying inter clock transfers wherein source clock signals and destination clock signals originate from different sources.

10. The non-transitory computer readable medium of claim 7, wherein the program instructions for identifying contributors to the clock uncertainties for each of the clock transfers includes,
   program instructions for determining contributors for a source clock of a clock network; and
   program instructions for determining contributors for a destination clock of the clock network.

11. The non-transitory computer readable medium of claim 7, wherein the program instructions for calculating jitter associated with each identified contributor for both set-up time and hold time includes,
   program instructions for calculating setup time uncertainty with a source clock and a fastest destination clock.

12. The non-transitory computer readable medium of claim 7, wherein the program instructions for calculating jitter associated with each identified contributor for both set-up time and hold time includes,
   program instructions for calculating hold time uncertainty with a source clock and a slowest destination clock.

13. The non-transitory computer readable medium of claim 7, further comprising:
   program instructions for combining first subcomponents of the jitter through a root sum square technique when the first subcomponents of the jitter have the random jitter; and
   program instructions for combining second subcomponents of the jitter through a linear technique when the second subcomponents of the jitter have the deterministic jitter.

14. A method for performing timing closure analysis on a circuit design, comprising;
   identifying contributors to clock uncertainties for a source clock and a destination clock for a data transfer of the circuit design;
   determining both setup clock uncertainty and hold clock uncertainty for the data transfer for each of the contributors;
   combining the setup clock uncertainty for each of the contributors;
   combining the hold clock uncertainty for each of the contributors;
   determining, through a processor, whether the data transfer meets timing constraints of the circuit design based on the combined setup clock uncertainty and the combined hold clock uncertainty; and
   determining whether jitter from the setup clock uncertainty for each of the contributors is a random jitter or a deterministic jitter, wherein the random jitter is included in the setup clock uncertainty through a root sum square and the deterministic jitter is included in the setup clock uncertainty through a linear addition.

15. The method of claim 14, wherein identifying contributors to clock uncertainties includes,
   identifying jitter from a phase lock loop; and
   identifying static phase error from the phase lock loop.

16. The method of claim 14, wherein determining both setup clock uncertainty and hold clock uncertainty for the data transfer for each of the contributors includes,
   utilizing the setup clock uncertainty as the hold clock uncertainty when a hold margin is not checked at a launch clock edge for the data transfer.

17. The method of claim 14, wherein the circuit design is for a programmable logic device.

18. The method of claim 14, further comprising:
   displaying results of the determining whether the data transfer meets the timing constraints.

* * * * *